US012484297B2

(12) United States Patent
Xie et al.

(10) Patent No.: US 12,484,297 B2
(45) Date of Patent: Nov. 25, 2025

(54) FORKSHEET TRANSISTOR WITH DUAL DEPTH LATE CELL BOUNDARY CUT

(71) Applicant: International Business Machines Corporation, Armonk, NY (US)

(72) Inventors: Ruilong Xie, Niskayuna, NY (US); Tsung-Sheng Kang, Ballston Lake, NY (US); Alexander Reznicek, Troy, NY (US); Sagarika Mukesh, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 18/192,247

(22) Filed: Mar. 29, 2023

(65) Prior Publication Data

US 2024/0332294 A1  Oct. 3, 2024

(51) Int. Cl.
*H10D 30/43* (2025.01)
*H01L 23/528* (2006.01)
(Continued)

(52) U.S. Cl.
CPC ......... *H10D 84/85* (2025.01); *H01L 23/5286* (2013.01); *H10D 30/019* (2025.01);
(Continued)

(58) Field of Classification Search
CPC ............ H10D 64/017; H10D 30/0273; H10D 30/0614; H10D 30/668; H10D 30/658; H10D 64/025–027; H10D 30/0275; H10D 30/6894; H10D 30/699; H10D 64/513; H10D 64/259; H10D 84/013; H10D 84/017; H10D 30/501–509; H10D 30/019–0198; H10D 84/85; H10D 30/43; H10D 30/6735; H10D 62/121; H10D 84/0151; H10D 84/038; H10D 30/014; H10D 30/6757; H01L 23/5286; H01L 21/76897

See application file for complete search history.

(56) References Cited

U.S. PATENT DOCUMENTS 9,536,738 B2 * 1/2017 Huang .................. H10D 62/122
9,640,531 B1 * 5/2017 Or-Bach ............... H01L 23/552
(Continued)

FOREIGN PATENT DOCUMENTS

CN           114334799 A     4/2022

*Primary Examiner* — Maliheh Malek
(74) *Attorney, Agent, or Firm* — Anthony Curro

(57) ABSTRACT

Embodiments are disclosed for a semiconductor structure. The semiconductor structure includes a first pair of field effect transistors (FETs). Additionally, the semiconductor structure includes a second pair of FETs. Further, the semiconductor structure includes a shallow gate cut that separates a first pair of gates, a first pair of channels, and a first pair of source/drain (S/D) epitaxies of the first pair of FETs. Additionally, the first pair of S/D epitaxies are wired to a backside power rail (BPR) by a backside contact. Further, the semiconductor structure includes a deep gate cut that separates a second pair of S/D epitaxies of the second pair of FETs. Additionally, one of the second pair of S/D epitaxies is wired to a back end of line (BEOL) interconnect via a frontside contact. Further, another of the second pair of S/D epitaxies is wired to the BPR by a backside contact.

20 Claims, 16 Drawing Sheets

(51) Int. Cl.
   *H10D 30/00* (2025.01)
   *H10D 30/01* (2025.01)
   *H10D 30/65* (2025.01)
   *H10D 30/67* (2025.01)
   *H10D 62/10* (2025.01)
   *H10D 64/01* (2025.01)
   *H10D 84/01* (2025.01)
   *H10D 84/03* (2025.01)
   *H10D 84/85* (2025.01)

(52) U.S. Cl.
   CPC ........... *H10D 30/43* (2025.01); *H10D 30/501* (2025.01); *H10D 30/658* (2025.01); *H10D 30/6735* (2025.01); *H10D 62/121* (2025.01); *H10D 64/017* (2025.01); *H10D 84/013* (2025.01); *H10D 84/0151* (2025.01); *H10D 84/017* (2025.01); *H10D 84/038* (2025.01)

(56) References Cited

U.S. PATENT DOCUMENTS

| | | | | |
|---|---|---|---|---|
| 12,328,859 | B2* | 6/2025 | Xie | H10B 10/125 |
| 12,419,024 | B2* | 9/2025 | Anderson | H01L 23/481 |
| 12,419,104 | B2* | 9/2025 | Chen | H10D 64/017 |
| 2006/0258129 | A1 | 11/2006 | Park | H10B 41/40 257/E21.546 |
| 2017/0077314 | A1* | 3/2017 | Smith | H01L 21/76264 |
| 2018/0219064 | A1* | 8/2018 | Cheng | H10D 30/014 |
| 2019/0181224 | A1* | 6/2019 | Zhang | H10D 64/017 |
| 2021/0013106 | A1* | 1/2021 | Xie | H10D 30/025 |
| 2021/0082770 | A1* | 3/2021 | Xie | H01L 21/76849 |
| 2021/0111115 | A1* | 4/2021 | Morrow | H10D 62/393 |
| 2021/0134721 | A1* | 5/2021 | Chiang | H10D 30/6713 |
| 2021/0202385 | A1* | 7/2021 | Huang | H10D 84/834 |
| 2021/0305252 | A1* | 9/2021 | Chiang | H10D 30/024 |
| 2021/0305381 | A1* | 9/2021 | Chiang | H10D 84/0149 |
| 2021/0351303 | A1* | 11/2021 | Ju | H01L 21/76897 |
| 2021/0376071 | A1* | 12/2021 | Liu | H10D 30/6757 |
| 2021/0376093 | A1* | 12/2021 | Chu | H10D 62/121 |
| 2021/0407999 | A1* | 12/2021 | Huang | H10D 84/85 |
| 2022/0059460 | A1* | 2/2022 | Do | H01L 23/485 |
| 2022/0059571 | A1* | 2/2022 | Baek | H10D 84/907 |
| 2022/0130991 | A1* | 4/2022 | Yu | H10D 84/0151 |
| 2022/0139914 | A1* | 5/2022 | Cheng | H10D 30/6735 257/288 |
| 2022/0157957 | A1* | 5/2022 | Jin | H10D 30/6219 |
| 2022/0328477 | A1* | 10/2022 | Chen | H10D 84/038 |
| 2023/0015093 | A1* | 1/2023 | Young | H10B 53/30 |
| 2023/0065715 | A1* | 3/2023 | Xie | H10D 84/038 |
| 2023/0088578 | A1* | 3/2023 | Thomson | H01L 21/0259 257/351 |
| 2023/0178621 | A1* | 6/2023 | Xie | H10D 84/85 257/288 |
| 2023/0411292 | A1* | 12/2023 | Li | H10D 84/038 |
| 2023/0422461 | A1* | 12/2023 | Vega | H10B 10/12 |
| 2024/0079327 | A1* | 3/2024 | Xie | H01L 23/481 |
| 2024/0105768 | A1* | 3/2024 | Xie | H10D 84/83 |
| 2024/0105799 | A1* | 3/2024 | Xie | H10D 86/201 |
| 2024/0112984 | A1* | 4/2024 | Li | H01L 21/76897 |
| 2024/0113193 | A1* | 4/2024 | Li | H10D 84/013 |
| 2024/0114694 | A1* | 4/2024 | Dutta | H10D 1/682 |
| 2024/0120381 | A1* | 4/2024 | Shih | H10D 30/6735 |
| 2024/0121933 | A1* | 4/2024 | Tsutsui | H10B 10/125 |
| 2024/0136288 | A1* | 4/2024 | Jain | H01L 21/76897 |
| 2024/0153875 | A1* | 5/2024 | Xie | H10D 84/017 |
| 2024/0178128 | A1* | 5/2024 | Chen | H10D 30/6735 |
| 2024/0186374 | A1* | 6/2024 | Xie | H10D 84/013 |
| 2024/0203990 | A1* | 6/2024 | Xie | H10D 64/017 |
| 2024/0203994 | A1* | 6/2024 | Gupta | H01L 23/535 |
| 2024/0222227 | A1* | 7/2024 | Xie | H10D 84/83 |
| 2024/0222395 | A1* | 7/2024 | van der Straten | H10D 30/6757 |
| 2024/0395812 | A1* | 11/2024 | Lin | H10D 84/038 |
| 2024/0429283 | A1* | 12/2024 | Reznicek | H10D 30/6729 |
| 2024/0429299 | A1* | 12/2024 | Chung | H10D 30/43 |
| 2025/0133784 | A1* | 4/2025 | Liaw | H10D 84/832 |
| 2025/0142903 | A1* | 5/2025 | Kang | H10D 84/013 |
| 2025/0151344 | A1* | 5/2025 | Guler | H10D 62/121 |
| 2025/0185356 | A1* | 6/2025 | Kang | H10D 30/6735 |
| 2025/0192003 | A1* | 6/2025 | Xie | H01L 25/074 |
| 2025/0192048 | A1* | 6/2025 | Zhang | H10D 30/6729 |
| 2025/0194198 | A1* | 6/2025 | Qin | H10D 30/501 |
| 2025/0203933 | A1* | 6/2025 | Zhou | H10D 30/024 |
| 2025/0210520 | A1* | 6/2025 | Zou | H10D 62/121 |
| 2025/0212483 | A1* | 6/2025 | Xie | H10D 84/0151 |
| 2025/0212508 | A1* | 6/2025 | Reboh | H01L 21/76898 |
| 2025/0212523 | A1* | 6/2025 | Mazza | H10D 64/252 |
| 2025/0221030 | A1* | 7/2025 | Shadman | H10D 64/017 |
| 2025/0261426 | A1* | 8/2025 | Mukesh | H10D 64/254 |
| 2025/0273575 | A1* | 8/2025 | Mukesh | H10D 64/017 |
| 2025/0275181 | A1* | 8/2025 | Zhou | H10D 64/01 |
| 2025/0275233 | A1* | 8/2025 | Mazza | H10D 84/0151 |

* cited by examiner

FORKSHEET TRANSISTOR WITH DUAL DEPTH LATE CELL BOUNDARY CUT

BACKGROUND

The present invention generally relates to semiconductor structures, and more particularly to a forksheet transistor with dual depth late cell boundary cut.

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm. 3 nm and beyond. Currently, traditional chip scaling continues to slow as process complexities and costs escalate at each node.

SUMMARY

Embodiments are disclosed for a semiconductor structure. The semiconductor structure includes a first pair of field effect transistors (FETs). Additionally, the semiconductor structure includes a second pair of FETs. Further, the semiconductor structure includes a shallow gate cut that separates a first pair of gates, a first pair of channels, and a first pair of source/drain (S/D) epitaxies of the first pair of FETs. Additionally, the first pair of S/D epitaxies are wired to a backside power rail (BPR) by a backside contact. Further, the semiconductor structure includes a deep gate cut that separates a second pair of S/D epitaxies of the second pair of FETs. Additionally, one of the second pair of S/D epitaxies is wired to a back end of line (BEOL) interconnect via a frontside contact. Further, another of the second pair of S/D epitaxies is wired to the BPR by a backside contact.

Embodiments are disclosed for a semiconductor structure. The semiconductor structure includes multiple forksheet field effect transistors (FETs). The forksheet FETs include a first and second pair of field effect transistors (FETs). Further, the semiconductor structure includes a shallow gate cut that separates a first pair of gates, a first pair of channels, and a first pair of source/drain (S/D) epitaxies of the first pair of FETs. Additionally, the first pair of S/D epitaxies are wired to a backside power rail (BPR) by a backside contact. Further, the semiconductor structure includes a deep gate cut that separates a second pair of S/D epitaxies of the second pair of FETs. Additionally, one of the second pair of S/D epitaxies is wired to a back end of line (BEOL) interconnect via a frontside contact. Further, another of the second pair of S/D epitaxies is wired to the BPR by a backside contact. Additionally, a portion of the second backside contact has a horizontal component that overlaps with a region of the deep gate cut.

Embodiments are disclosed for a method of fabricating a semiconductor structure. The method includes forming a nanosheet that includes merged field effect transistors and a sacrificial placeholder under a first S/D epitaxy. The method also includes forming a deep gate cut through a first pair of S/D epitaxies that comprise the first S/D epitaxy. Further, the deep gate cut cuts through the first pair of S/D epitaxies. Additionally, the first S/D epitaxy is wired to a BEOL interconnect through a frontside contact. Further, a second S/D epitaxy of the first pair of S/D epitaxies is wired to a backside power rail (BSPR) via a first backside contact. Additionally, the method includes forming a shallow gate cut through a second pair of S/D epitaxies, wherein the second pair of S/D epitaxies is wired to the BSPR via a second backside contact.

BRIEF DESCRIPTION OF THE DRAWINGS

The following detailed description, given by way of example and not intended to limit the invention solely thereto, will best be appreciated in conjunction with the accompanying drawings, in which.

Figure 1:
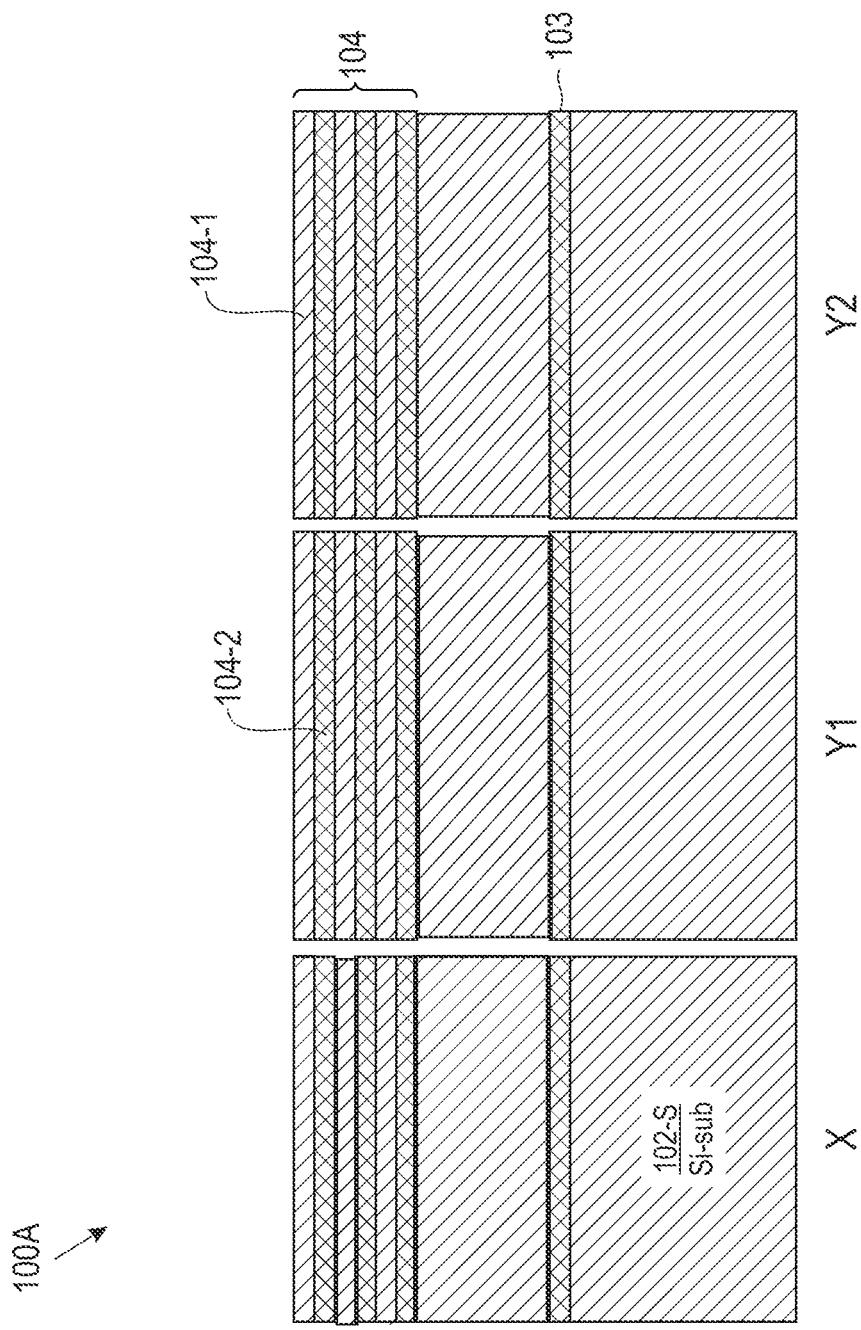
FIG. 1 is a cross-sectional view and a top view of a semiconductor structure during an intermediate step of a method of fabricating a forksheet transistor with dual depth late cell boundary cuts, in accordance with some embodiments of the present disclosure.

The drawings are not necessarily to scale. The drawings are merely schematic representations, not intended to portray specific parameters of the invention. For clarity and case of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the example embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed. The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle. In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In the field of semiconductor fabrication, it is possible to increase the scale of cell boundaries due to the use of backside contacts. However, increasing this scale can involve using a placeholder everywhere approach because it is more compatible with passive devices, and does not require a perfect placeholder profile. However, the placeholder everywhere approach is not compatible with forksheet FETs, which use both n-type and p-type FETs. Accordingly, some embodiments of the present disclosure provide a method for fabricating forksheet FETs with backside contacts. However, it is noted that some embodiments may not have these potential advantages. Further, these potential advantages are not necessarily required of all embodiments of the present disclosure.

FIG. 1 is a cross-sectional view 100A and a top view 100B of a semiconductor structure during an initial step of a method of fabricating a forksheet transistor with dual depth late cell boundary cut, in accordance with some embodiments of the present disclosure. The top view 100B includes nanosheet stack 104, shown here with cut lines X, Y1, and Y2.

The cross-sectional view 100A includes multiple views along the cut lines X, Y1, and Y2. In the cross-section view 100A, the X, Y1, and Y2 views are similar, with each including a substrate 102-S, etch stop layer 103, epitaxy substrate 102-E, and nanosheet stack 104. The nanosheet stack 104 may be formed from an alternating series of silicon (Si) channel nanosheets 104-1 and silicon germanium (SiGe) sacrificial nanosheets 104-2. The nanosheet stack 104 may be formed on the epitaxy substrate 102-E, which is formed on the etch stop layer 103, which is formed on the silicon substrate 102-S. The etch stop layer 103 may include, for example silicon germanium, to facilitate thinning the substrate to a desired thickness. Although only six alternating nanosheets 104-1, 104-2 are shown, one or more additional sacrificial nanosheets and/or channel nanosheets can optionally be epitaxially grown in an alternating fashion, and the properties of any additional nanosheets are the same as the corresponding nanosheets described herein.

In one or more embodiments, the alternating series of silicon germanium sacrificial nanosheets 104-2 and silicon channel nanosheets 104-1 are formed by epitaxially growing one layer and then the next until a desired number of layers and a desired thickness of each layer is achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be undoped or can be doped during deposition (in-situ doped) by adding dopants, n-type dopants (e.g., phosphorus or arsenic) or p-type dopants (e.g., boron or gallium), depending on the type of transistor. For example, in at least one embodiment, each nanosheet stack 104 includes some combination of silicon channel nanosheets 104-1 undoped. The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on other exposed surfaces, such as silicon dioxide or silicon nitride surfaces.

In some embodiments, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Known processing techniques have been applied to the alternating series of silicon germanium sacrificial nanosheets 104-2 and silicon channel nanosheets 104-1 shown in FIG. 1 to form the nanosheet stack 104. For example, the known processing techniques can include the formation of hard masks (not shown) over the silicon channel nanosheet 104-1. The hard masks can be formed by first depositing the hard mask material (for example silicon nitride) onto the top silicon channel nanosheet using, for example, chemical vapor deposition (CVD), plasma enhanced CVD (PECVD) or any suitable technique for dielectric deposition that does not induce a physical or chemical change to silicon channel nanosheet 104-1. According to an exemplary embodiment, the hard mask material is deposited onto the top silicon channel nanosheet and then patterned into a plurality of the individual hard masks.

Figure 2:
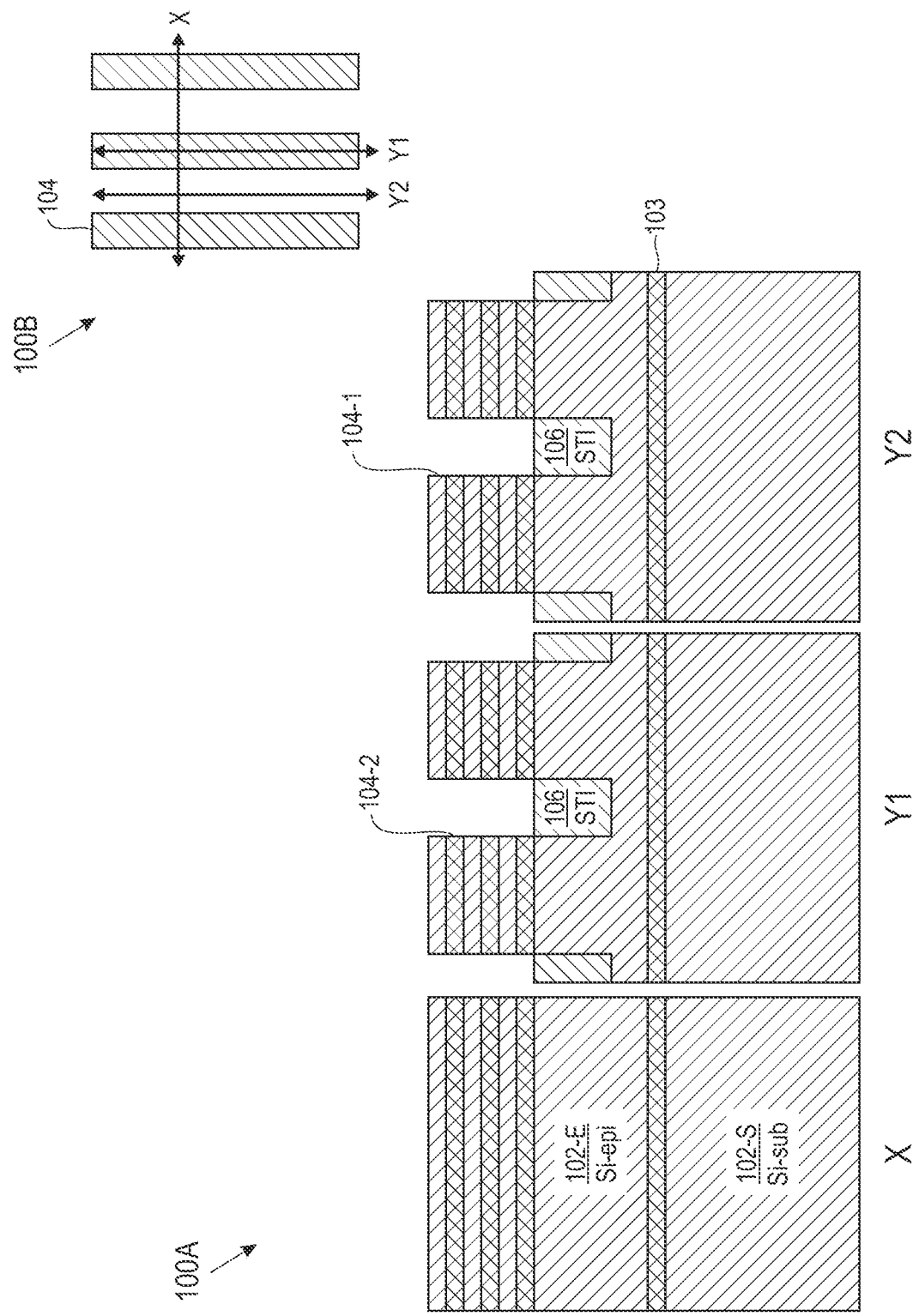
FIG. 2 is a cross-sectional view and a top view of a semiconductor structure during an intermediate step of a method of fabricating a forksheet transistor with dual depth late cell boundary cut, in accordance with some embodiments of the present disclosure.

FIG. 2 is a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after nanosheet patterning and performing a shallow trench isolation (STI) process. Nanosheet patterning involves patterning the hard mask. Patterning the hard mask is commensurate with a desired footprint and location of the channel nanosheet stacks 104, which will subsequently be used to form the channel regions of bottom semiconductor devices disclosed herein. According to an exemplary embodiment, reactive-ion etching (RIE) can be used to transfer the hard mask pattern into the alternating silicon and silicon germanium layers to form the nanosheet stacks 104. As shown, the top view 100B includes three nanosheet stacks 104 resulting from the patterning.

The STI process creates an STI layer 106 that prevents electric current leakage between adjacent semiconductor device components. In general, STI is performed early during the semiconductor device fabrication process, before transistors are formed. The STI process involves etching a pattern of trenches in silicon, depositing one or more dielectric materials (such as silicon dioxide) to fill the trenches, and removing the excess dielectric using a technique such as chemical-mechanical planarization.

Figure 3:
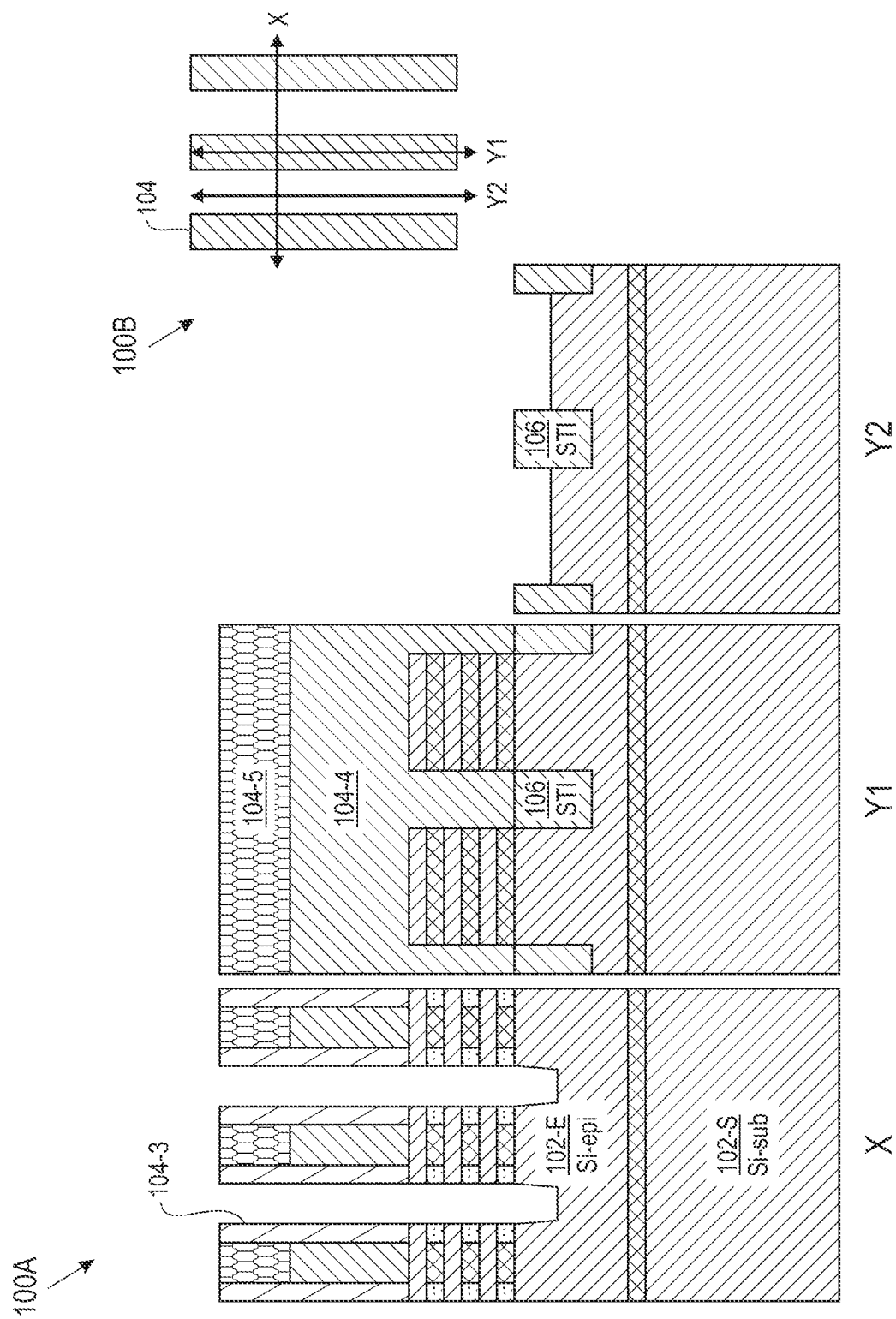
FIG. 3 is a cross-sectional view and a top view of a semiconductor structure during an intermediate step of a method of fabricating a forksheet transistor with dual depth late cell boundary cut, in accordance with some embodiments of the present disclosure.

FIG. 3 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after dummy gate formation, spacer formation, nanosheet recess, and inner spacer formation.

The dummy gate 104-4 is formed over and around the nanosheet gate stacks 104 according to known techniques. As shown in the Y1 view, the dummy gate 104-4 is formed over the tops and sidewalls of the nanosheet stacks 104. In one or more embodiments, the dummy gate 104-4 is formed from a thin a layer of silicon oxide (SiO2) and amorphous silicon (a-Si). More specifically, a relatively thin layer of silicon oxide is conformally deposited over and around the nanosheet gate stacks 104 followed by a blanket layer of amorphous silicon. The spacers 104-3 are formed along the vertical sidewalls of the dummy gate 104-4 and hard gate mask 104-5, as shown. The spacers 104-3 can be formed using known techniques, which includes spacer material deposition followed by directional RIE of the deposited spacer material.

The spacers 104-3 along with the gate hard masks 104-5 are in effect used as a mask, and portions of the silicon germanium sacrificial nanosheets 104-2 and the silicon channel nanosheets 104-1 not protected by the dummy gate 104-4, the spacers 104-3, and the gate hard masks 104-5 are recessed or removed using, for example, a silicon RIE process. Recessing or etching may continue until an uppermost surface of the epitaxy substrate 102-E is exposed and the openings are formed. After, the silicon germanium sacrificial nanosheets 104-2 are laterally recessed to make room for the inner spacers 104-7. In one or more embodiments, the silicon germanium sacrificial nanosheets 104-2 are laterally recessed using a hydrogen chloride (HCL) gas isotropic etch process, which etches silicon germanium without attacking silicon. Cavities (not shown) are formed by spaces that were occupied by the removed portions of silicon germanium sacrificial nanosheets 104-2.

The inner spacers 104-7 are formed by first conformally depositing a spacer material over the structure to fill the cavities created by laterally recessing the silicon germanium sacrificial nanosheets 104-2. As used herein, "conformal" means that a material layer has a continuous thickness, or substantially continuous thickness. For example, a continuous thickness generally means a first thickness as measured from a bottom surface to a topmost surface that is the same as a second thickness as measured from an inner sidewall surface to an outer sidewall surface. The conformal spacer material is then isotropically etched to remove all portions except those remaining in the cavities and forming the inner spacers 104-7. In one or more embodiments, the inner spacers 104-7 are made from a nitride containing material, for example silicon nitride (SiN). Although the inner spacers 104-7 disclosed herein are often formed from a nitride containing material, they can be formed from any material which supports selectivity during subsequent device fabrication operations. Selectivity, as used in the present description, refers to the tendency of a process operation to impact a particular material. One example of low selectivity is a relatively slow etch rate. One example of a higher or greater selectivity is a relatively faster etch rate. For the described embodiments, a material for the inner spacers 104-7 can be selected based on a selectivity of subsequent device fabrication operations for the selected material being below a predetermined threshold.

The inner spacers 104-7 are positioned such that subsequent etching processes used to remove the silicon germanium sacrificial nanosheets 104-2 during device fabrication do not also attack subsequently formed source drain regions.

Figure 4:
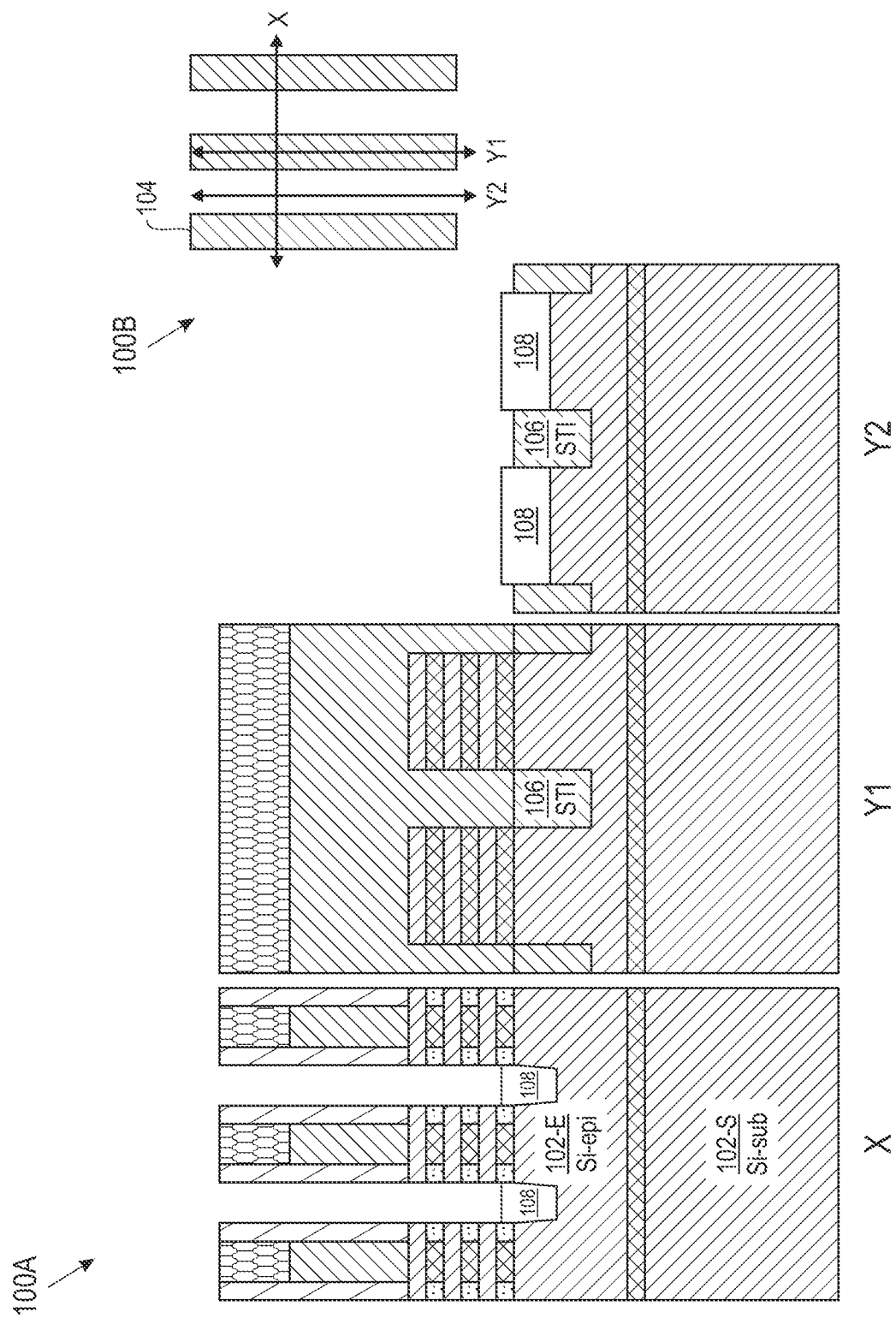
FIG. 4 is a cross-sectional view and a top view of a semiconductor structure during an intermediate step of a method of fabricating a forksheet transistor with dual depth late cell boundary cut, in accordance with some embodiments of the present disclosure.

FIG. 4 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after growth of the sacrificial SiGe placeholders 108.

Figure 5:
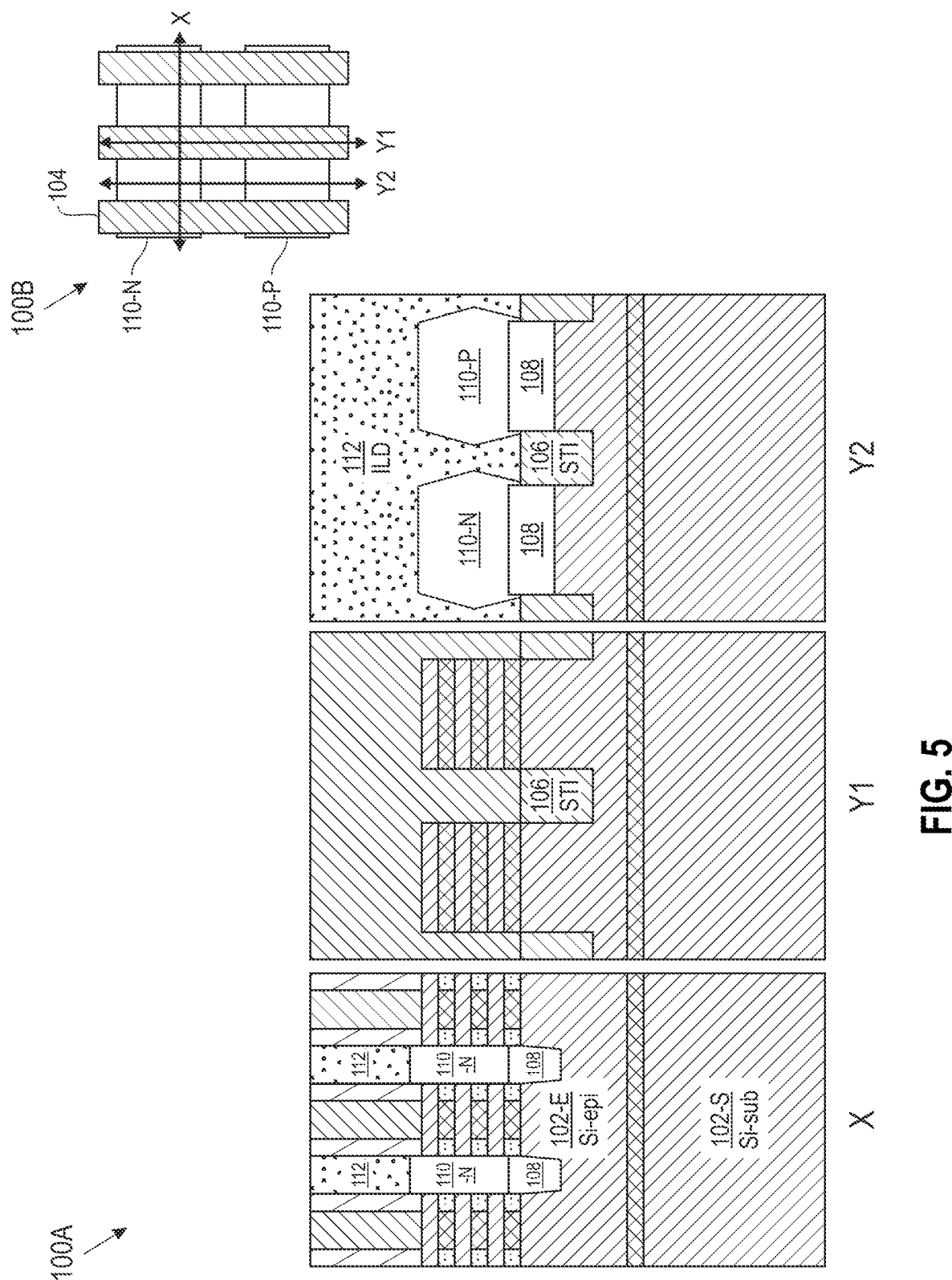
FIG. 5 is a cross-sectional view and a top view of a semiconductor structure during an intermediate step of a method of fabricating a forksheet transistor with dual depth late cell boundary cut, in accordance with some embodiments of the present disclosure.

FIG. 5 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after source/drain (S/D) epitaxial growth, interlayer dielectric (ILD) deposit, and chemical-mechanical planarization (CMP).

The source drain (S/D) regions 110-N. 110-P (collectively referred to as S/D regions 110) are formed using an epitaxial layer growth process on the exposed ends of the silicon channel nanosheets 104-1. Typically, in-situ doping is used to dope the bottom S/D regions 110, thereby creating the junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type devices are formed by implanting different types of dopants to selected regions of the device to form the necessary junction(s). N-type devices can be formed by implanting arsenic (As) or phosphorous (P), and p-type devices can be formed by implanting boron (B).

The ILD 112 is formed by depositing an interlayer dielectric material over the structure according to known techniques. The ILD 112 is formed on the source drain regions 110. Further, the ILD 112 can be polished using known techniques until a topmost surface of the ILD 112 is flush, or substantially flush, with topmost surfaces of the dummy gate 104-4 and the spacers 104-3. The ILD 112 can be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In another embodiment, a self-planarizing material such as a spin-on glass (SOG) or a spin-on low-k dielectric material such as SiLK™ can be used as the ILD 112. Using a self-planarizing dielectric material as the ILD 112 can avoid the need to perform a subsequent planarizing step.

The S/D epitaxial growth involves growing the n-type epitaxies (N-epi) 110-N and p-type epitaxies (P-epi) 110-P. Further, the ILD deposit involves depositing a dielectric material to form the ILD 112. Additionally, the CMP involves removing the hard gate mask 104-5, and the spacers 104-3 surrounding the hard gate mask 104-5.

Figure 6:
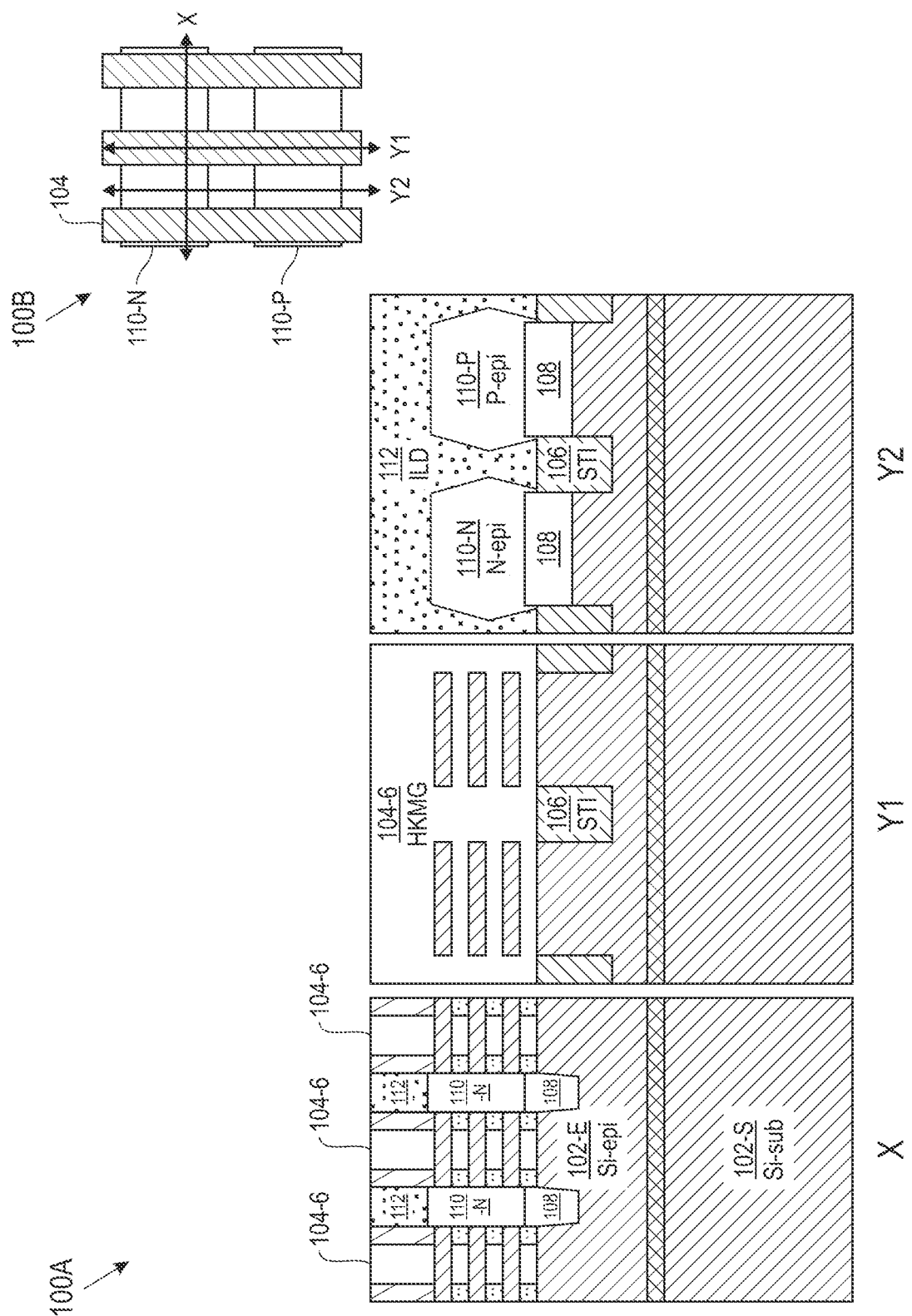
FIG. 6 is a cross-sectional view and a top view of a semiconductor structure during an intermediate step of a method of fabricating a forksheet transistor with dual depth late cell boundary cut, in accordance with some embodiments of the present disclosure.

FIG. 6 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after dummy gate removal, sacrificial SiGe removal, and replacement gate formation. More specifically, dummy gate removal involves removing the dummy gates 104-4. Additionally, sacrificial SiGe removal involves removing the silicon germanium sacrificial nanosheets 104-2 selective to the silicon channel nanosheets 104-1 according to known wet or dry etching techniques, such as, for example, vapor phased dry HCl etch. After etching, the silicon channel nanosheets 104-1 remain suspended and supported on opposite ends by the inner spacers 104-7.

Further, replacement gate formation involves conformally depositing a gate dielectric layer (e.g., high-k metal gate 104-6) directly on exposed surfaces within the openings and spaces left by removing the dummy gate 104-5 and the silicon germanium sacrificial nanosheets 104-2. For example, the gate dielectric layer is conformally deposited along exposed surfaces of the fins, the silicon channel nanosheets 104-1, and the STI layer 106. Additionally, the gate dielectric layer is conformally deposited along exposed surfaces of the spacers 104-3 and the inner spacers 104-7.

The high-k metal gate (HKMG) 104-6 can be formed by any deposition technique including, for example, chemical vapor deposition (CVD), plasma enhanced chemical vapor deposition (PECVD), physical vapor deposition (PVD), sputtering, or atomic layer deposition (ALD). In an embodiment, the HKMG 104-6 can have a thickness in ranging from approximately 1 nm to approximately 5 nm. Other thicknesses that are lesser than, or greater than, the aforementioned thickness range can also be used for the HKMG 104-6.

The HKMG 104-6 is composed of any known gate dielectric materials, for example, oxide, nitride, and/or oxynitride. In an example, the HKMG 104-6 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials. For example, a silicon dioxide layer and a high-k gate dielectric layer can be formed and used together as the HKMG 104-6. In at least one embodiment, the HKMG 104-6 is composed of hafnium oxide. Additionally, the HKMG 104-6 may include one or more layer of work function metals, such as TiN, TiAl, TiC, TiAlC, or combinations for different transistors, and optional low resistance metal fill, such as W.

Figure 7:
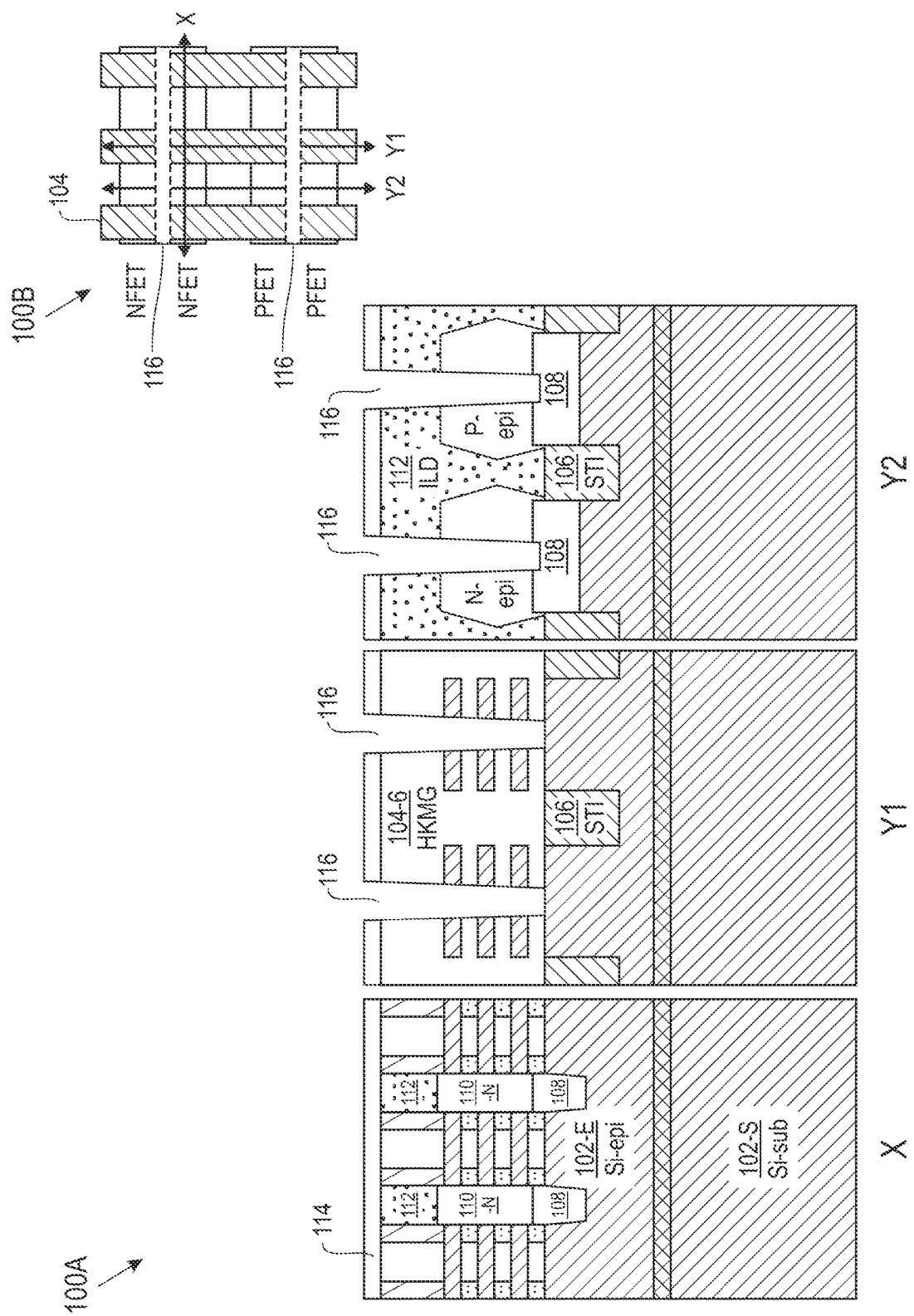
FIG. 7 is a cross-sectional view and a top view of a semiconductor structure during an intermediate step of a method of fabricating a forksheet transistor with dual depth late cell boundary cut, in accordance with some embodiments of the present disclosure.

FIG. 7 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after late gate cut patterning. Late gate cut patterning involves depositing a patterning hardmask 114 and forming gate cuts 116. The patterning hardmask 114 can be similar to the hard gate mask 104-5.

Figure 8:
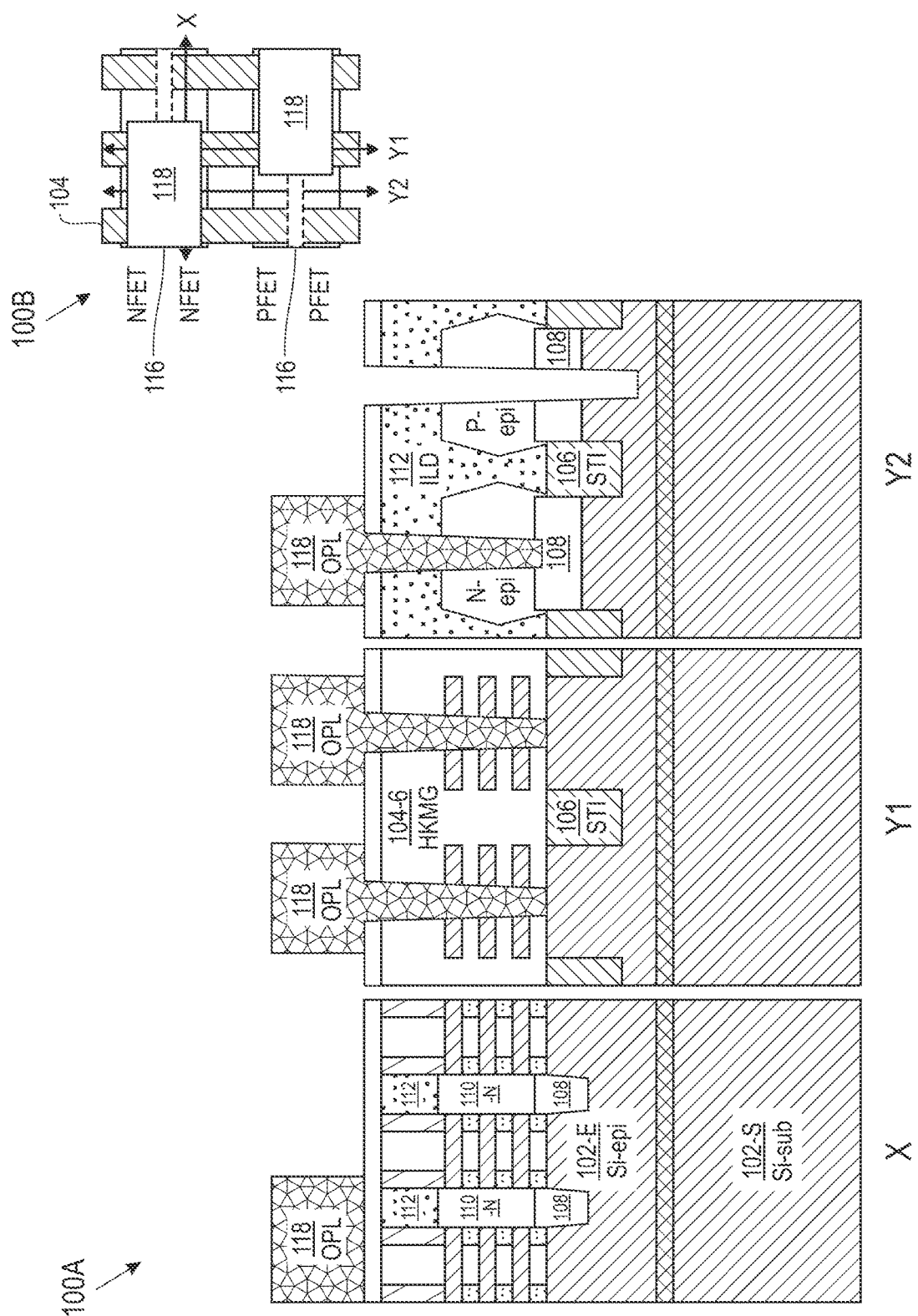
FIG. 8 is a cross-sectional view and a top view of a semiconductor structure during an intermediate step of a method of fabricating a forksheet transistor with dual depth late cell boundary cut, in accordance with some embodiments of the present disclosure.

FIG. 8 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after forming a mask and additional cut patterning. More specifically, forming the mask can involve depositing an organic planarization layer (OPL) 118 or other material that is capable of being planarized or etched by known techniques. In an embodiment, for example, the OPL 118 can be an amorphous carbon layer able to withstand subsequent processing temperatures. Further, the OPL 118 can have a thickness sufficient to cover existing structures. After deposition of the OPL 118, a dry etching technique is applied to pattern the OPL 118. In this way, the OPL deposited may protect the structure such that the additional cut patterning only goes through the p-epi region, not the n-epi region or the HKMG region. After the OPL is selectively deposited, the additional cut happens such that only one of the gate cuts is extended. More specifically, the additional cut patterning can involve an additional gate cut to extend the gate cut 116 shown in view Y2, through the sacrificial SiGe placeholder 108, and into the epitaxy substrate 102-E.

Figure 9:
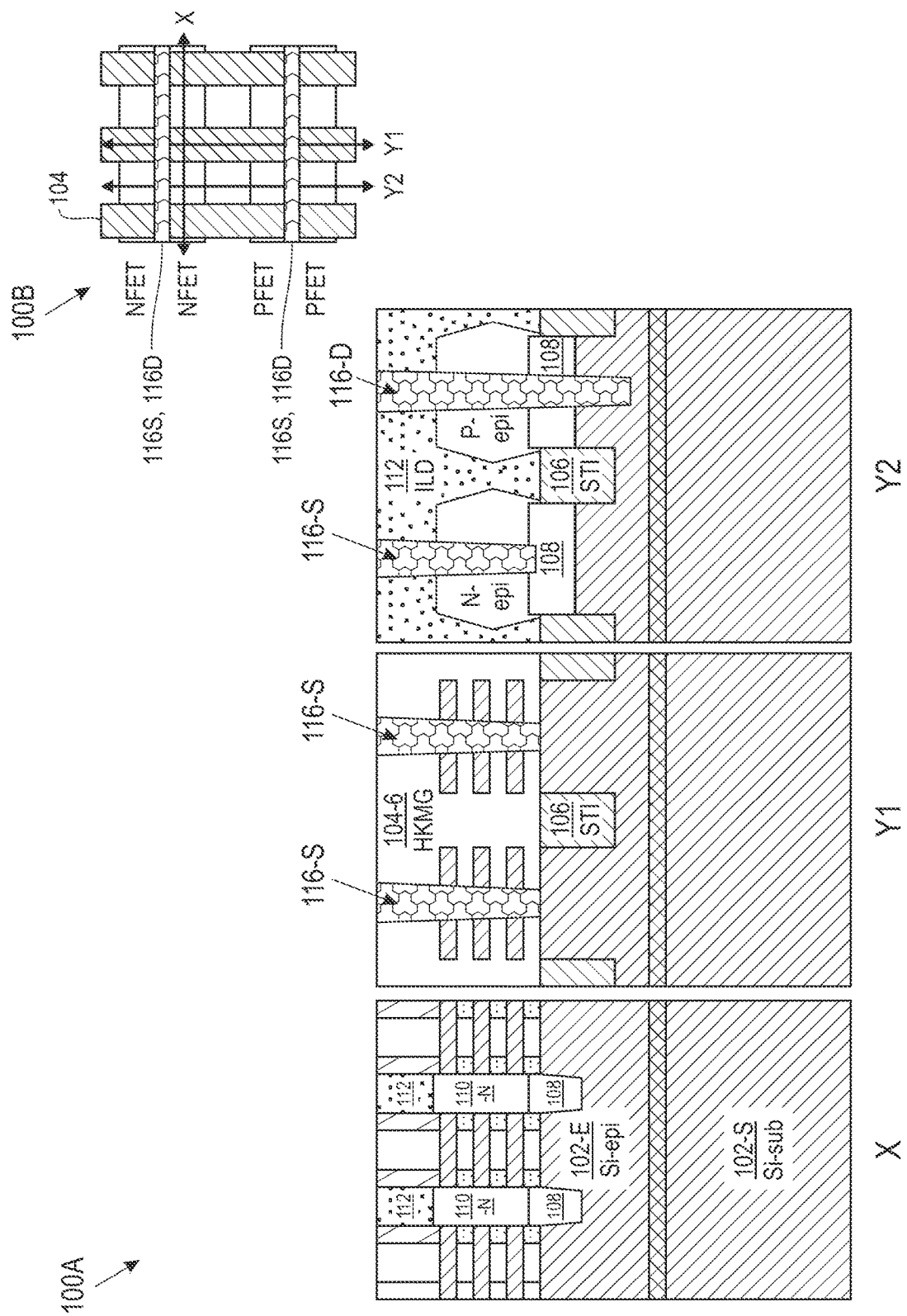
FIG. 9 is a cross-sectional view and a top view of a semiconductor structure during an intermediate step of a method of fabricating a forksheet transistor with dual depth late cell boundary cut, in accordance with some embodiments of the present disclosure.

FIG. 9 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after a CMP process and dielectric fill. The CMP process can involve removing the patterning hardmask 114 and the OPL 118. Further, the dielectric fill can involve depositing a dielectric material in the shallow gate cut regions 116-S and deep gate cut regions 116-D.

Figure 10:
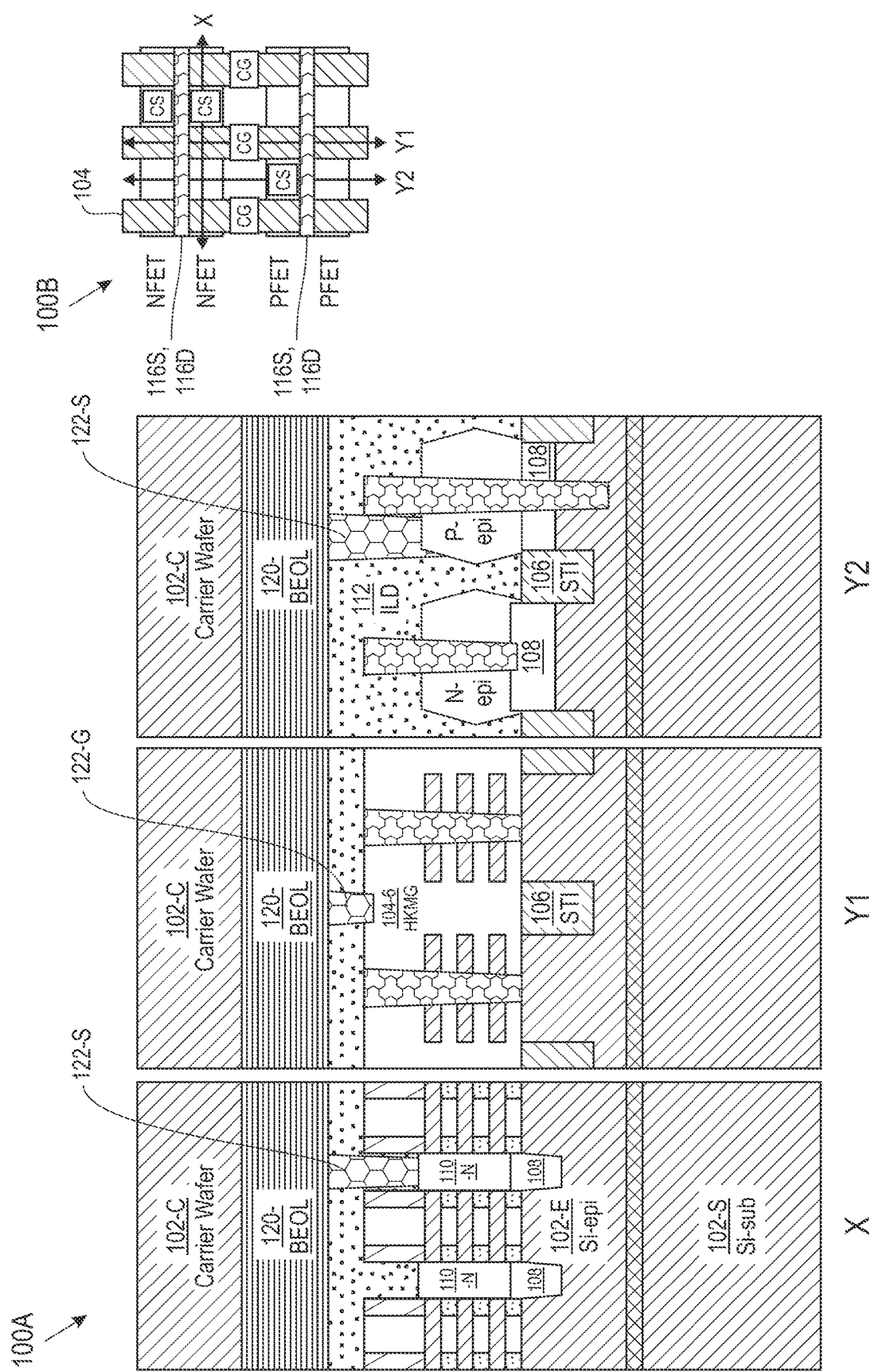
FIG. 10 is a cross-sectional view and a top view of a semiconductor structure during an intermediate step of a method of fabricating a forksheet transistor with dual depth late cell boundary cut, in accordance with some embodiments of the present disclosure.

FIG. 10 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after forming middle of line (MOL) contacts, back end of line (BEOL) interconnect, and bonding the carrier wafer. Forming the MOL contacts involves blanket depositing ILD 112 across the structure and forming contact trenches in the middle-of-line dielectric layer. The contact trenches are then filled with a conductive material to form frontside contacts, (e.g., the S/D contacts 122-S and gate contacts 122-G, collectively referred to as contacts 122) according to known techniques. The contacts 122 may include any suitable conductive material, such as, for example, copper, ruthenium, aluminum, tungsten, cobalt, or alloys thereof. In some embodiments, a metal silicide is formed at the bottom of the contact trenches prior to filling them with the conductive material. After, excess conductive material can be polished using known techniques until a topmost surface of the contacts 122 are flush, or substantially flush, with topmost surfaces of the middle-of-line dielectric layer, as illustrated.

After forming the contacts 122, the back end of line 120-BEOL is subsequently formed according to known techniques. Next, the carrier wafer 102-C is attached, or removably secured, to the back end of line 120-BEOL. In general, and not necessarily depicted, the carrier wafer 102-C may be thicker than the other layers. Temporarily bonding the structure to a thicker carrier provides improved handling and additional support for backside processing of thin wafers. After backside processing described below, the structure may be de-bonded, or removed, from the carrier wafer 102-C according to known techniques.

Figure 11:
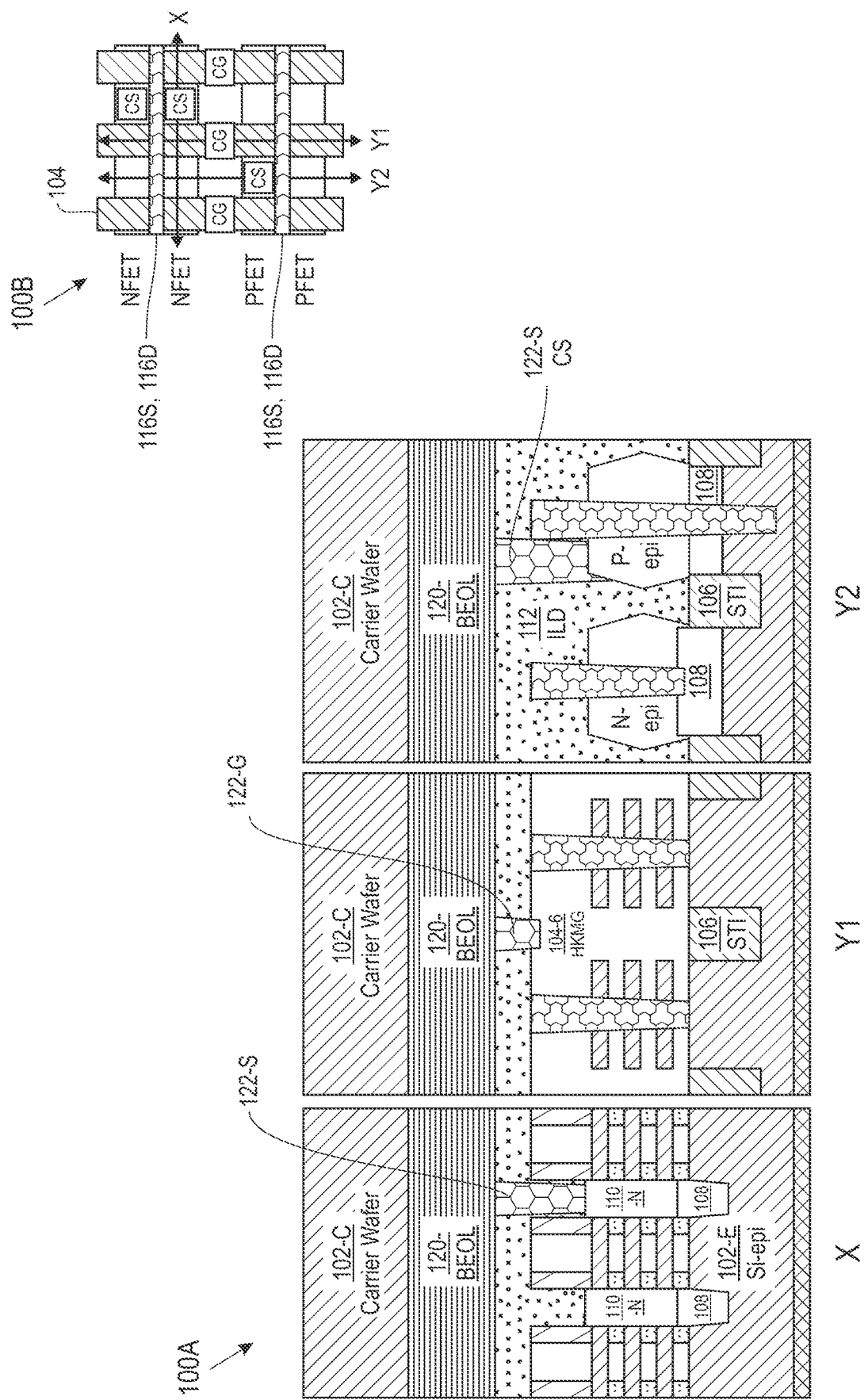
FIG. 11 is a cross-sectional view and a top view of a semiconductor structure during an intermediate step of a method of fabricating a forksheet transistor with dual depth late cell boundary cut, in accordance with some embodiments of the present disclosure.

FIG. 11 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after a wafer flip and Si substrate removal stopping on etch stop layer 103. More specifically, the structure is flipped 180 degrees to prepare for backside processing. Although in reality, the structure will likely be physically flipped 180 degrees, the structures illustrated in the figures provided herein are not flipped or rotated, and the features and processes will continue to be described relative to the structure's orientation as illustrated in the figures. In general, backside processing includes fabrication or processing of the structure opposite the active device and wiring layers. Next, the substrate 102-S is recessed, and completely removed, to expose the etch stop layer 103 according to known techniques, as shown.

Figure 12:
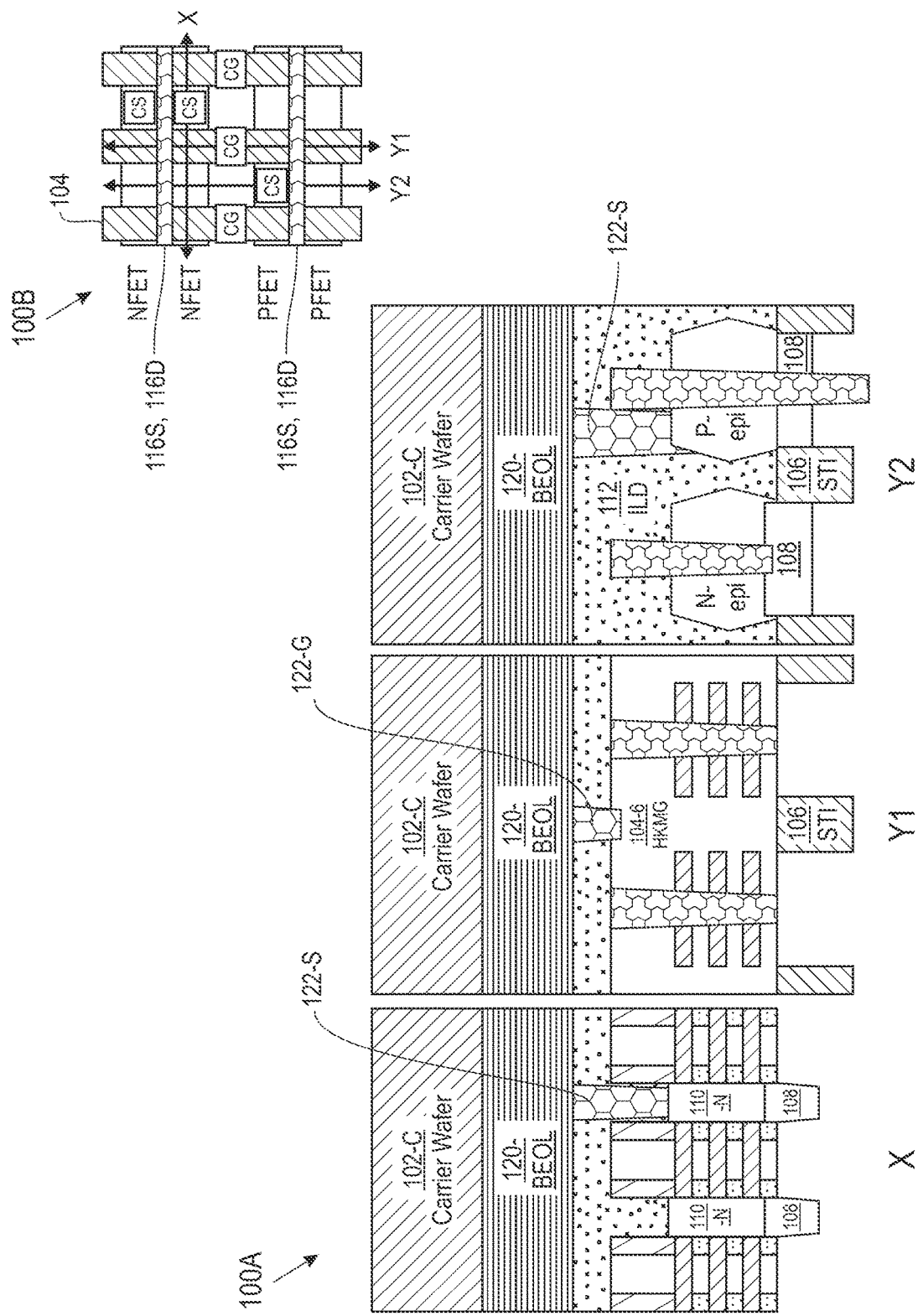
FIG. 12 is a cross-sectional view and a top view of a semiconductor structure during an intermediate step of a method of fabricating a forksheet transistor with dual depth late cell boundary cut, in accordance with some embodiments of the present disclosure.

FIG. 12 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after etch stop layer removal, and remaining Si removal. More specifically, etch stop layer removal involves recessing the etch stop layer 103 according to known techniques. Further, the remaining Si removal involves recessing the epitaxy substrate 102-E according to known techniques.

Figure 13:
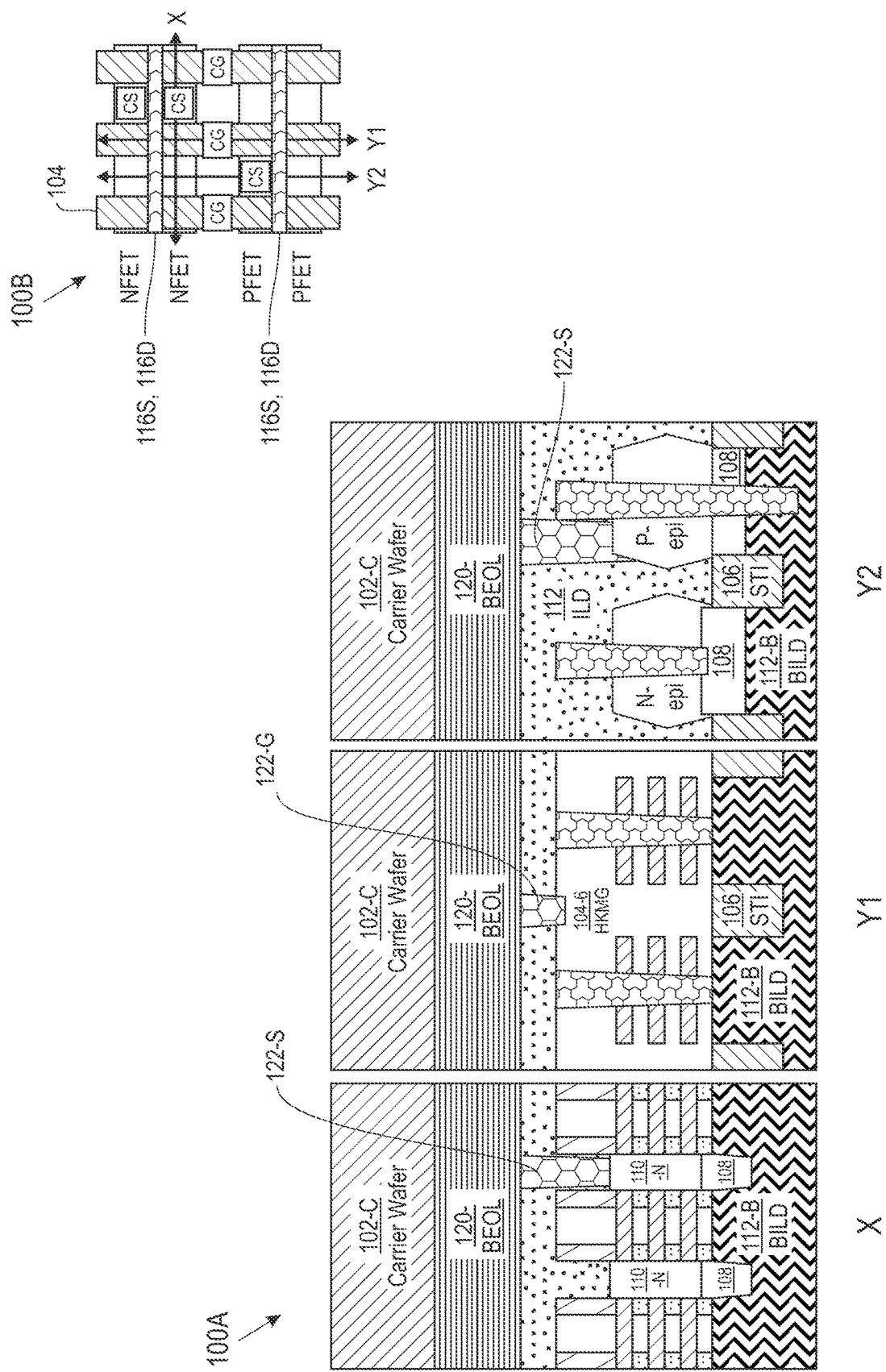
FIG. 13 is a cross-sectional view and a top view of a semiconductor structure during an intermediate step of a method of fabricating a forksheet transistor with dual depth late cell boundary cut, in accordance with some embodiments of the present disclosure.

FIG. 13 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after backside ILD (BILD) deposit. The BILD deposit involves depositing an interlayer dielectric material to form the BILD 112-B.

Figure 14:
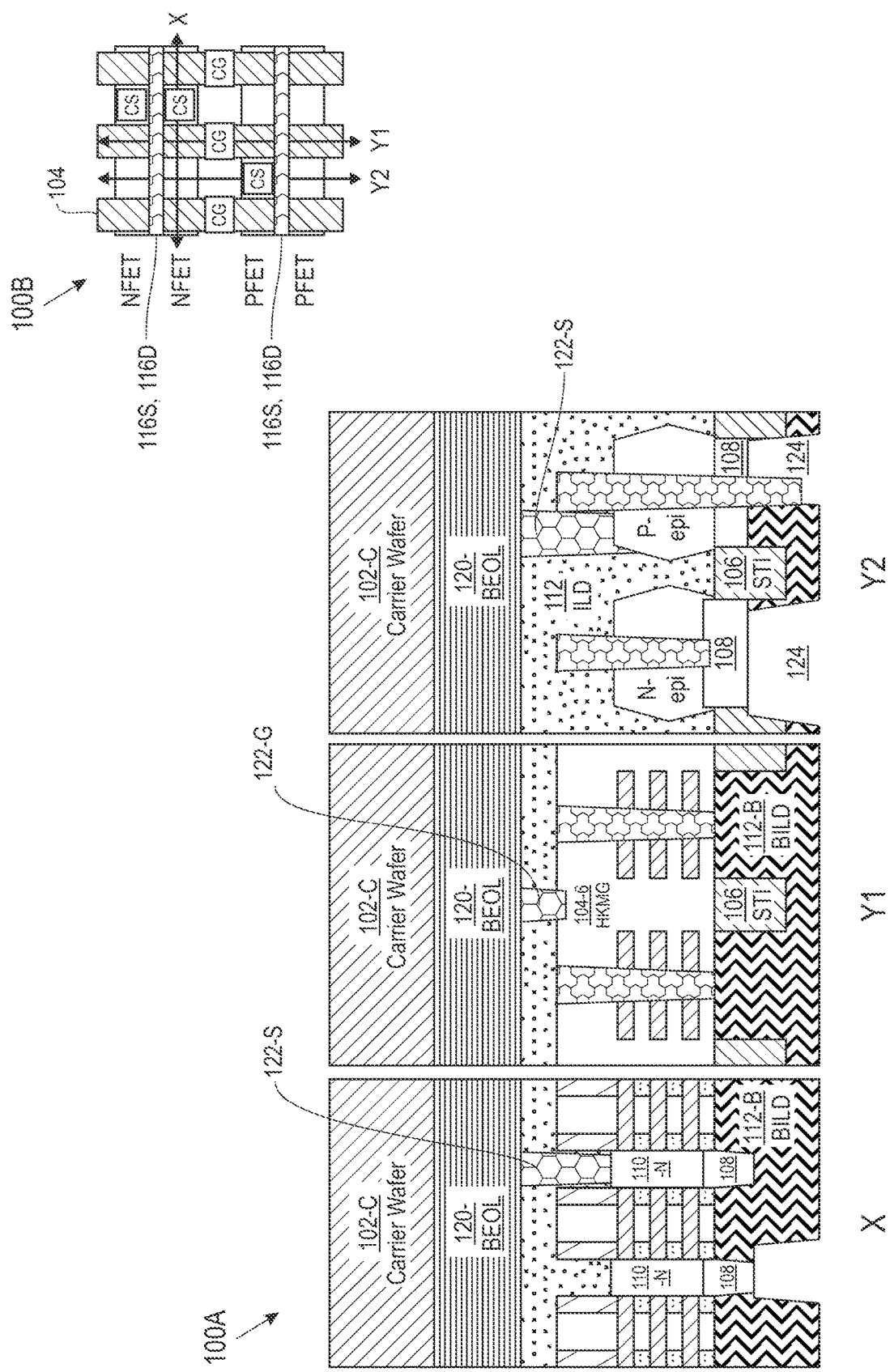
FIG. 14 is a cross-sectional view and a top view of a semiconductor structure during an intermediate step of a method of fabricating a forksheet transistor with dual depth late cell boundary cut, in accordance with some embodiments of the present disclosure.

FIG. 14 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after backside contact patterning. Backside contact patterning involves removing portions of the BILD 112-B in regions where backside contacts will be subsequently formed. As shown, backside contact patterning creates backside trenches 124. According to some embodiments of the present disclosure, when both epis need to be wired to the backside power rail (BSPR), fabrication involves using a merged contact over the shallow cut (e.g., shallow regions 116-S). Alternatively, when only one side of the epi is to be wired to the BSPR, fabrication involves forming a backside contact opening that is self-aligned to the deep cut (e.g., deep region 116-D).

Figure 15:
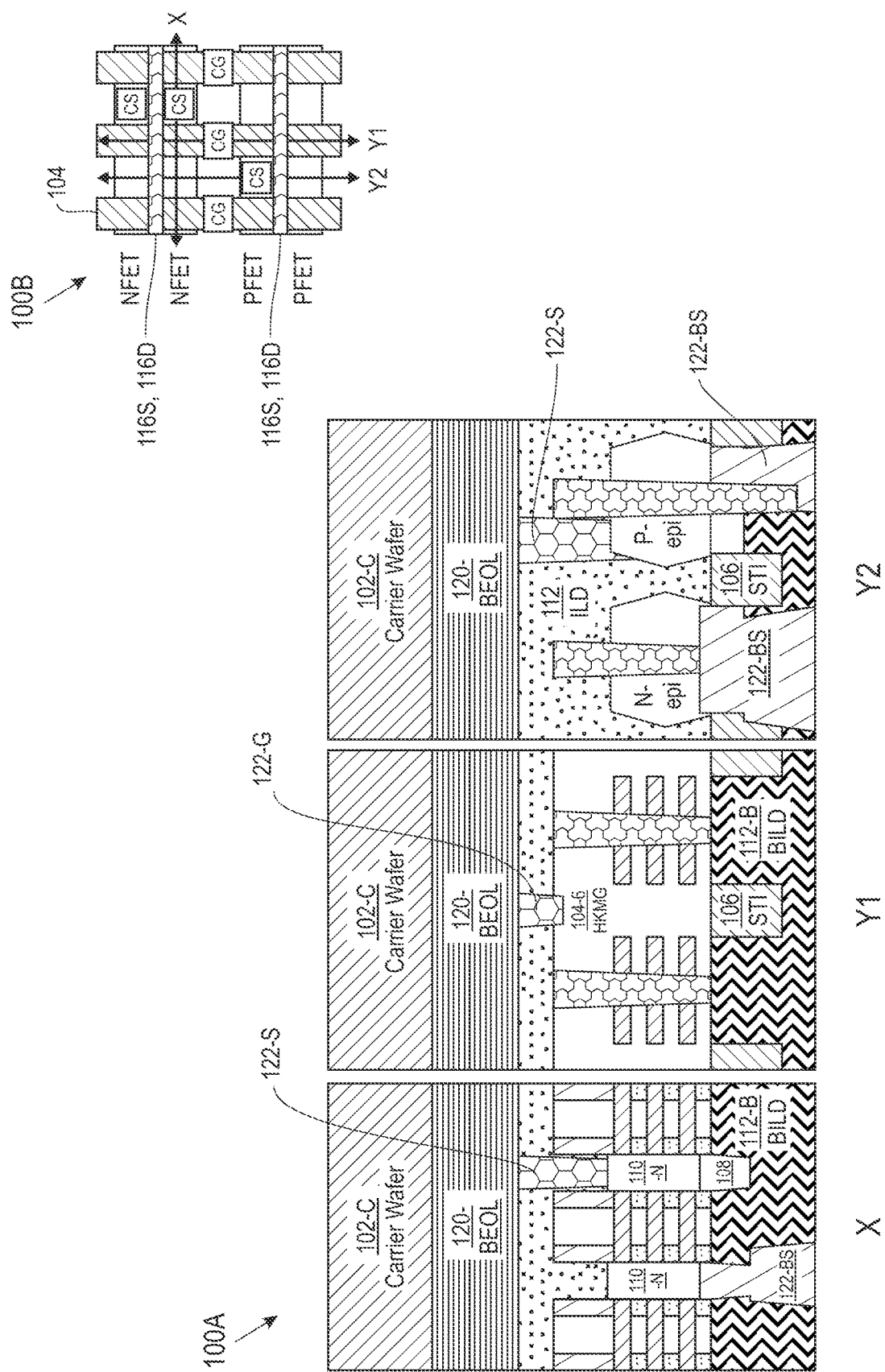
FIG. 15 is a cross-sectional view and a top view of a semiconductor structure during an intermediate step of a method of fabricating a forksheet transistor with dual depth late cell boundary cut, in accordance with some embodiments of the present disclosure.

FIG. 15 are a cross-sectional view 100A and a top view 100B of a semiconductor structure during an intermediate step of a method of fabricating a forksheet transistor with dual depth late cell boundary cut, in accordance with some embodiments of the present disclosure. The cross-sectional view 100A and top view 100B represent fabrication after placeholder removal and backside contact metallization. Placeholder removal involves recessing the sacrificial SiGe placeholders 108. Additionally, backside contact metallization involves forming backside contacts 122-BS. The backside trenches 124 are then filled with a conductive material to form the backside contacts 122-BS according to known techniques. The backside contacts 122-BS may include any suitable conductive material, such as, for example, copper, ruthenium, aluminum, tungsten, cobalt, or alloys thereof. In some embodiments, a metal silicide is formed at the bottom of the backside trenches 124 prior to filling them with the conductive material. After, excess conductive material can be polished using known techniques until bottommost surfaces of the backside contacts 122-BS are flush, or substantially flush, with topmost surfaces of the BILD 112-B, as illustrated. It is noted, the backside contacts 122-BS may include, for example, backside gate contacts as illustrated in view X, and backside source drain contacts as illustrated in view Y2, which span the S/D region 110-N (e.g., N-epi).

Figure 16:
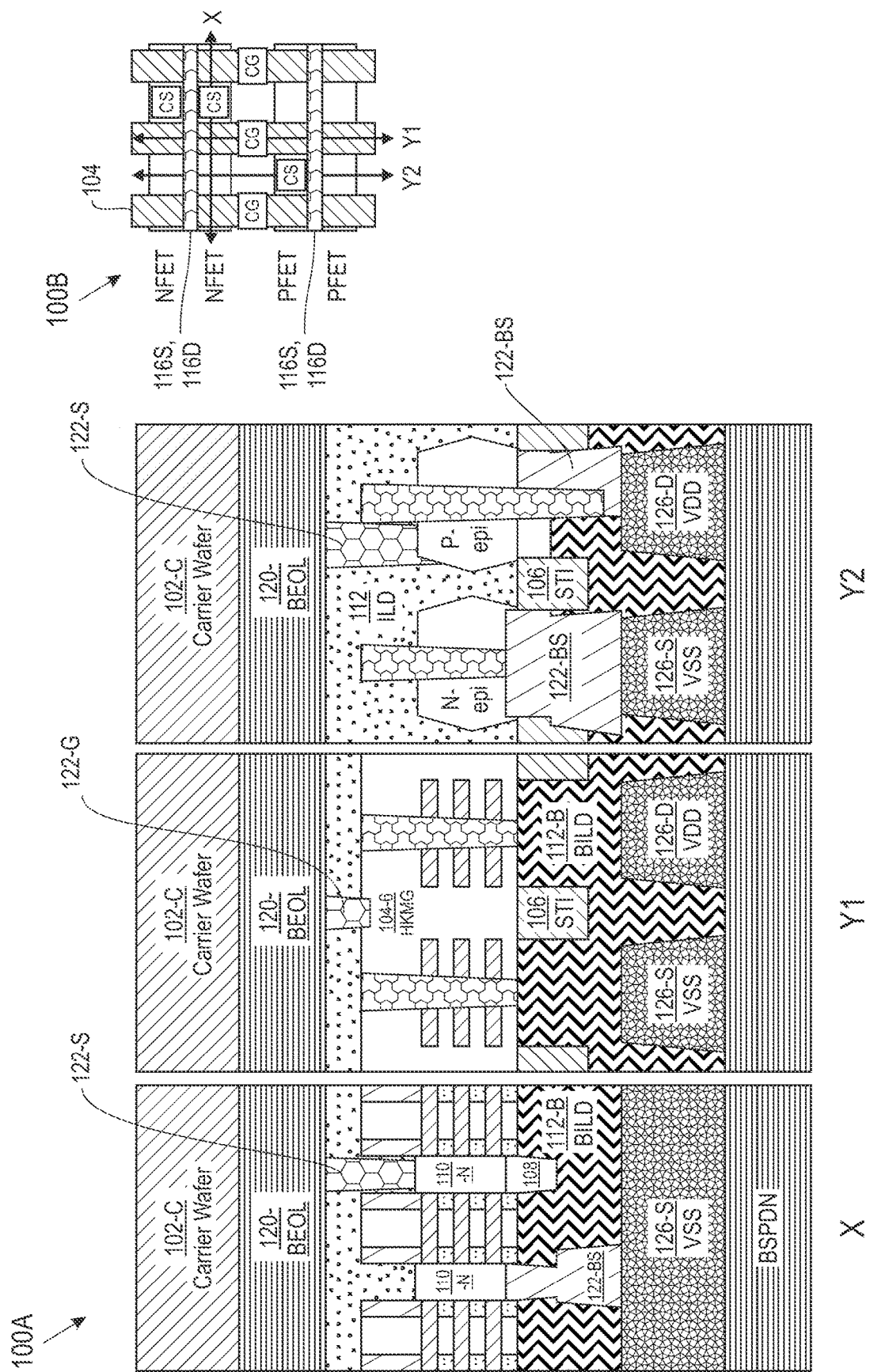
FIG. 16 is a cross-sectional view and a top view of a semiconductor structure after forming a forksheet transistor with dual depth late cell boundary cut, in accordance with some embodiments of the present disclosure.

FIG. 16 are a cross-sectional view 100A and a top view 100B of a semiconductor structure after forming a forksheet transistor with dual depth late cell boundary cut, in accordance with some embodiments of the present disclosure. The cross-sectional view 100A and top view 100B represent fabrication after backside power rail (BSPR) and backside power distribution network (BSPDN) formation. Forming the BSPR can involve forming the source rails VSS 126-S and drain rails VDD 126-D. According to some embodiments of the present disclosure, there is an increased overlap between the backside contacts 122-BS and the rail VDD 126-D of the BSPR. Further, the processes and formation of BSPDN structures is not within the scope of this disclosure and may be performed using known methods and techniques.

Additionally, some embodiments of the present disclosure provide a method for fabricating the semiconductor structure described with respect to FIGS. 1-16. More specifically, the method includes forming a nanosheet that includes merged field effect transistors and a sacrificial placeholder under a first S/D epitaxy. The method also includes forming a deep gate cut through a first pair of S/D epitaxies that comprise the first S/D epitaxy. Further, the deep gate cut cuts through the first pair of S/D epitaxies. Additionally, the first S/D epitaxy is wired to a BEOL interconnect through a frontside contact. Further, a second S/D epitaxy of the first pair of S/D epitaxies is wired to a backside power rail (BSPR) via a first backside contact. Additionally, the method includes forming a shallow gate cut through a second pair of S/D epitaxies, wherein the second pair of S/D epitaxies is wired to the BSPR via a second backside contact.

Further, the method includes forming a middle of line (MOL) interconnect, forming the BEOL interconnect, and bonding a carrier wafer to the BEOL interconnect. Additionally, the method includes flipping the carrier wafer and removing a substrate. Further, the method includes forming a self-aligned backside contact landing over the sacrificial placeholder. Additionally, the self-aligned backside contact is self-aligned to a region of the deep gate cut. Further, the method includes removing an additional sacrificial placeholder and forming a second backside contact in place of the removed additional sacrificial placeholder. Additionally, the method includes filling the shallow gate cut and the deep gate cut with a dielectric material.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks. When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category. For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations. Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to one skilled in the art. Therefore, it is intended that the following claims be interpreted as covering all such alterations and modifications as fall within the true spirit and scope of the invention.

What is claimed is:

1. A semiconductor structure comprising:
   a first pair of field effect transistors (FETs);
   a second pair of FETs;
   a shallow gate cut, wherein the shallow gate cut separates:
      a first pair of gates of the first pair of FETs;
      a first pair of channels of the first pair of FETs; and
      a first pair of source/drain epitaxies of the first pair of FETs, wherein the first pair of source/drain epitaxies are wired to a backside power rail by a first backside contact; and
   a deep gate cut, wherein the deep gate cut separates a second pair of source/drain epitaxies of the second pair of FETs, and wherein one of the second pair of source/drain epitaxies is wired to a back end of line (BEOL) interconnect via a frontside contact, and wherein a second of the second pair of source/drain epitaxies is wired to the backside power rail by a second backside contact.

2. The semiconductor structure of claim 1, wherein a portion of the second backside contact has a horizontal component that overlaps with a region of the deep gate cut.

3. The semiconductor structure of claim 2, wherein the horizontal component increases a contact area between the second backside contact and the backside power rail.

4. The semiconductor structure of claim 1, further comprising a sacrificial placeholder that is disposed under the one of the second pair of source/drain epitaxies that is wired to the BEOL interconnect.

5. The semiconductor structure of claim 1, wherein the first pair of FETs comprises a pair of n-type FETs.

6. The semiconductor structure of claim 5, wherein the second pair of FETs comprises a pair of p-type FETs.

7. The semiconductor structure of claim 1, wherein the first backside contact comprises a merged contact that spans a region of the shallow gate cut.

8. The semiconductor structure of claim 1, comprising a plurality of forksheet FETs.

9. A semiconductor structure comprising:
   a plurality of forksheet field effect transistors (FETs), comprising:
      a first pair of FETs; and
      a second pair of FETs;
   a shallow gate cut, wherein the shallow gate cut separates:
      a first pair of gates of the first pair of FETs;
      a first pair of channels of the first pair of FETs; and
      a first pair of source/drain epitaxies of the first pair of FETs, wherein the first pair of source/drain epitaxies are wired to a backside power rail by a first backside contact; and
   a deep gate cut, wherein the deep gate cut separates a second pair of source/drain epitaxies of the second pair of FETs, and wherein one of the second pair of source/drain epitaxies is wired to a back end of line (BEOL) interconnect via a frontside contact, and wherein a second of the second pair of source/drain epitaxies is wired to the backside power rail by a second backside contact, and wherein a portion of the second backside contact has a horizontal component that overlaps with a region of the deep gate cut.

10. The semiconductor structure of claim 9, wherein the horizontal component increases a contact area between the second backside contact and the backside power rail.

11. The semiconductor structure of claim 9, further comprising a sacrificial placeholder that is disposed under the one of the second pair of source/drain epitaxies that is wired to the BEOL interconnect.

12. The semiconductor structure of claim 9, wherein the first pair of FETs comprises a pair of n-type FETs.

13. The semiconductor structure of claim 12, wherein the second pair of FETs comprises a pair of p-type FETs.

14. The semiconductor structure of claim 9, wherein the first backside contact comprises a merged contact that spans a region of the shallow gate cut.

15. A method for fabricating a semiconductor device, the method comprising:
   forming a nanosheet comprising:
      merged field effect transistors; and
      a sacrificial placeholder under a first source/drain epitaxy;
   forming a deep gate cut through a first pair of source/drain epitaxies that comprise the first source/drain epitaxy, wherein the deep gate cut cuts through the first pair of source/drain epitaxies, and wherein the first source/drain epitaxy is wired to a back end of line (BEOL) interconnect through a frontside contact, and wherein a second source/drain epitaxy of the first pair of source/drain epitaxies is wired to a backside power rail (BSPR) via a first backside contact; and forming a shallow gate cut through a second pair of source/drain epitaxies, wherein the second pair of source/drain epitaxies is wired to the BSPR via a second backside contact.

16. The method of claim 15, further comprising:
forming a middle of line (MOL) interconnect;
forming the BEOL interconnect; and
bonding a carrier wafer to the BEOL interconnect.

17. The method of claim 16, further comprising:
flipping the carrier wafer; and
removing a substrate.

18. The method of claim 17, further comprising forming a self-aligned backside contact landing over the sacrificial placeholder, wherein the self-aligned backside contact is self-aligned to a region of the deep gate cut.

19. The method of claim 15, further comprising:
removing an additional sacrificial placeholder; and
forming a second backside contact in place of the removed additional sacrificial placeholder.

20. The method of claim 15, further comprising filling the shallow gate cut and the deep gate cut with a dielectric material.

\* \* \* \* \*